(12) United States Patent
Li et al.

(10) Patent No.: US 8,977,314 B2
(45) Date of Patent: Mar. 10, 2015

(54) SMART AGC FOR WIDEBAND MULTI-STANDARD RFIC

(75) Inventors: Tao Li, Campbell, CA (US); Shih Hsiung Mo, San Jose, CA (US); Hans Wang, Mountain View, CA (US); Binglei Zhang, San Jose, CA (US)

(73) Assignee: Aviacomm Inc., Santa Clara, CA (US)

( * ) Notice: Subject to any disclaimer, the term of this patent is extended or adjusted under 35 U.S.C. 154(b) by 90 days.

(21) Appl. No.: 13/620,049

(22) Filed: Sep. 14, 2012

(65) Prior Publication Data

US 2014/0080549 A1 Mar. 20, 2014

(51) Int. Cl.
*H04M 1/00* (2006.01)

(52) U.S. Cl.
USPC .......................... 455/550.1; 455/571; 375/345

(58) Field of Classification Search
USPC ......... 455/571, 246.1–247.1, 550.1; 370/297; 375/345
See application file for complete search history.

(56) References Cited

U.S. PATENT DOCUMENTS

| | | | | |
|---|---|---|---|---|
| 2002/0075944 A1* | 6/2002 | Zalio et al. | | 375/147 |
| 2006/0035595 A1* | 2/2006 | Shi | | 455/73 |
| 2006/0141965 A1* | 6/2006 | Hennig | | 455/247.1 |
| 2006/0222118 A1* | 10/2006 | Murthy et al. | | 375/345 |
| 2008/0273636 A1* | 11/2008 | Zhu et al. | | 375/345 |
| 2012/0319775 A1* | 12/2012 | Nakamura | | 330/129 |
| 2013/0077544 A1* | 3/2013 | Gomez et al. | | 370/297 |

\* cited by examiner

*Primary Examiner* — Nathan Taylor
(74) *Attorney, Agent, or Firm* — Shun Yao; Park, Vaughan, Fleming & Dowler LLP

(57) ABSTRACT

One embodiment of the present invention provides an automatic gain control (AGC) module for a wireless communication system that includes a plurality of amplifiers. The AGC module includes a receiving mechanism configured to receive an input that indicates a total amount of gain adjustment; a collecting mechanism configured to collect a number of parameters associated with the amplifiers; a determining mechanism configured to determine a desired performance requirement; a gain-control engine configured to generate a gain profile for the amplifiers based on the collected parameters, the total amount of gain, and the desired performance requirement; and an output mechanism configured to output a plurality of control signals based on the generated gain profile, wherein a respective control signal independently controls gain of a corresponding amplifier, thereby enabling the wireless communication system to achieve the total amount of gain adjustment while meeting the desired performance requirement.

16 Claims, 5 Drawing Sheets

SMART AGC FOR WIDEBAND MULTI-STANDARD RFIC

BACKGROUND

1. Field

The present disclosure relates generally to automatic gain control (AGC) at the RF front-end of a wireless communication system. More specifically, the present disclosure relates to a system and a method to implement smart AGC at the RF front-end of a multi-standard wireless transceiver.

2. Related Art

Traditional wireless communication systems are usually designed for a specific standard, such as GSM (Global System for Mobile Communications), Wideband Code Division Multiple Access (W-CDMA), WiFi, LTE (Long Term Evolution), etc., just to name a few. Current demand for the convergence of wireless services, in which users can access different standards from the same wireless device, is driving the development of multi-standard and multi-band transceivers, which are capable of transmitting/receiving radio signals in the entire wireless communication spectrum (most are in a frequency range from 300 MHz to 3 GHz).

The multi-standard requirement means that the RF front-end (the circuitry between the antenna and the digital baseband stage) needs to provide flexible automatic gain control (AGC) that can optimally adjust amplifier gains for the different standards.

SUMMARY

One embodiment of the present invention provides an automatic gain control (AGC) module for a wireless communication system that includes a plurality of amplifiers. The AGC module includes a receiving mechanism configured to receive an input that indicates a total amount of gain adjustment; a collecting mechanism configured to collect a number of parameters associated with the amplifiers; a determining mechanism configured to determine a desired performance requirement; a gain-control engine configured to generate a gain profile for the amplifiers based on the collected parameters, the total amount of gain, and the desired performance requirement; and an output mechanism configured to output a plurality of control signals based on the generated gain profile, wherein a respective control signal independently controls gain of a corresponding amplifier, thereby enabling the wireless communication system to achieve the total amount of gain adjustment while meeting the desired performance requirement.

In a variation on this embodiment, while determining the desired performance requirement, the determining mechanism is configured to determine a wireless communication standard that is currently active.

In a further variation, the desired performance requirement is specified by the wireless communication standard.

In a variation on this embodiment, the desired performance requirement includes one or more of: a noise figure requirement, a power efficiency requirement, and a linearity requirement.

In a variation on this embodiment, while generating the gain profile, the gain-control engine is configured to perform a table lookup.

In a variation on this embodiment, the AGC module is configured to receive the input from a baseband digital signal processor (DSP).

In a further embodiment, the AGC module is a separate component of the baseband DSP.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

Embodiments of the present invention provide a solution for achieving smart AGC at the RF front-end of a multi-standard wireless transceiver. In one embodiment, the RF front-end includes a programmable AGC module that can control the gain of each individual amplifier in the RF front-end based on the current active standard and the characteristics of each individual amplifier.

RF Receiver Front-End with Programmable AGC Module

Automatic gain control (AGC) has been a key requirement in designing wireless transceivers. More specifically, in the receiving path the received signal is controlled by the AGC to maintain at a proper level or within a suitable range to ensure that the analog-to-digital converter (ADC) can obtain sufficient resolution and avoid clipping. In conventional transceiver designs, the AGC function is provided by the baseband digital signal processor (DSP), which directly controls the gains of the amplifiers.

Figure 1:
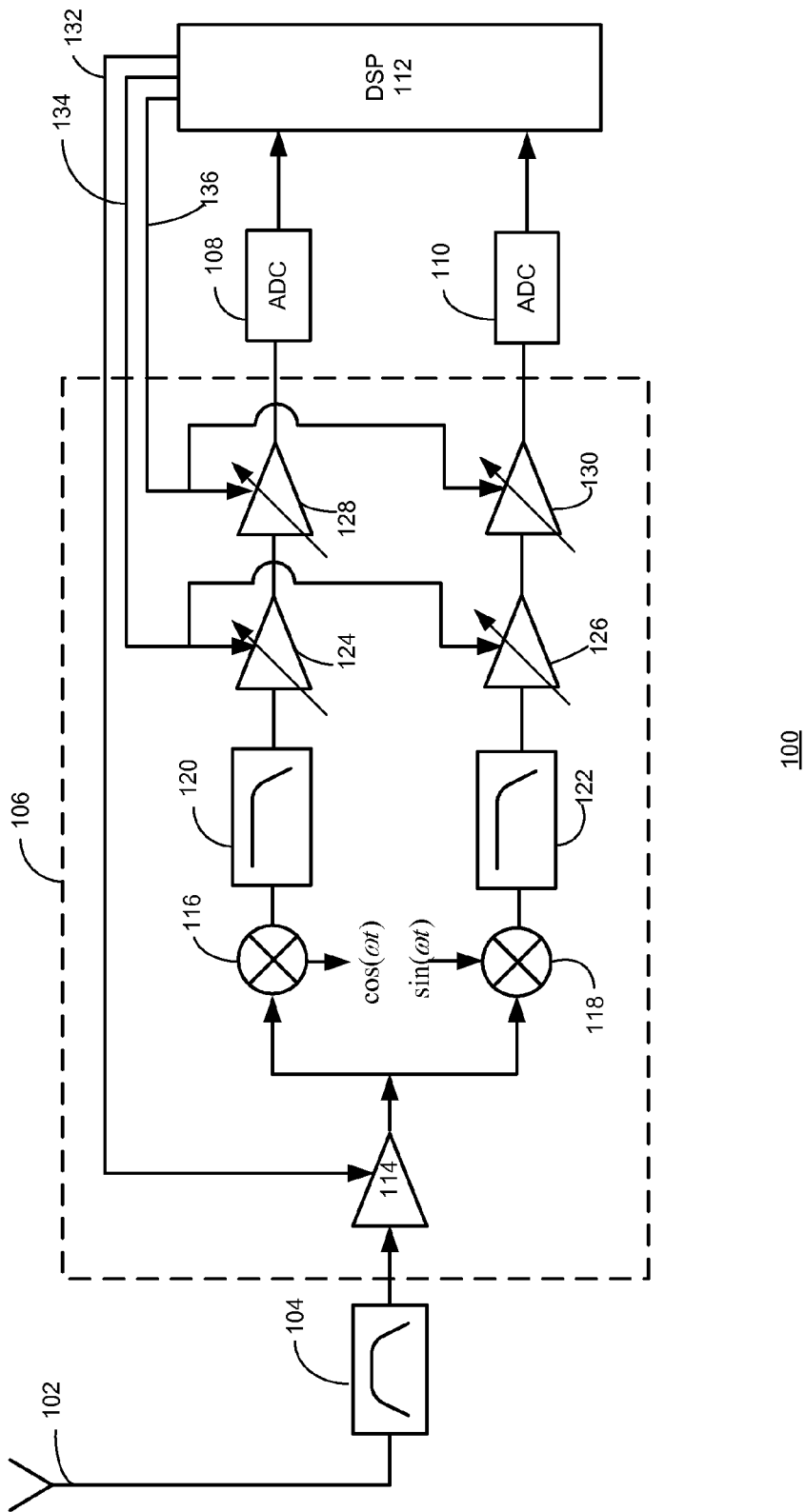
FIG. 1 presents a diagram illustrating the architecture of a conventional wireless receiver.

FIG. 1 presents a diagram illustrating the architecture of a conventional wireless receiver. In FIG. 1, receiver 100 includes an antenna 102, a band-pass filter (BPF) 104, a radio-frequency integrated circuit (RFIC) chip 106, ADCs 108 and 110, and a baseband digital signal processor (DSP) 112. RFIC chip 106 includes demodulation-and-amplification circuits, including a low-noise amplifier (LNA) 114, mixers 116 and 118, low-pass filters (LPFs) 120 and 122, first-stage variable gain amplifiers (VGAs) 124 and 126, and second-stage VGAs 128 and 130.

During operation, incoming RF signals received via antenna 102 are filtered and amplified by BPF 104 and amplifier 114, respectively. Note that, for a multi-standard, multi-band receiver, BPF 104 can be tunable to ensure that only signals within the desired band are filtered through. Subsequently, the RF signal is directly down-converted to in-phase (I) and quadrature (Q) baseband signals by an IQ demodulator, which includes mixers 116 and 118. For graphing simplicity, other standard components used in the IQ demodulator, such as the local oscillator and the phase shifter, are not shown in the figure.

After down-conversion, RF signals in the I and Q channels are filtered by LPFs 120 and 122, respectively, which reject signals at the summation frequency and allow the baseband signals to pass. Subsequently, two stages of VGAs amplify the baseband signals before sending the I and Q baseband signals to ADCs 108 and 110, respectfully. ADCs 108 and 110 convert the analog signals to the digital domain and send the digital signals to baseband DSP 112 for further processing.

In addition to accomplishing other computational tasks, such as decoding, channel estimation, etc., baseband DSP 112 also performs the function of AGC. More specifically, based on signals received from ADCs 108 and 110, baseband DSP 112 computes how much gain may be needed in order to get better outputs from ADCs 108 and 110. As one can see in FIG. 1, in the conventional approach, DSP 112 directly controls the gain of the various amplifier stages in RFIC chip 106, including amplifiers 114, 124, 126, 128, and 130) via electrical connections 132, 134, and 136. This conventional AGC approach can be very burdensome to DSP 112 because controlling each individual amplifier inside RFIC chip 106 can be very complicated, especially when the different amplifiers may have different characteristics, such as noise figure, power efficiency, and nonlinearity. In addition, different wireless standards may have different performance requirements in terms of noise figure, power consumption, and nonlinearity.

To provide a flexible AGC solution that can meet the multi-standard requirement while relieving the baseband DSP from having to control gain at each individual amplifier stage directly, in embodiments of the present invention, a separate, standalone AGC module is included in the wireless receiver. More specifically, the AGC module receives an input from the baseband DSP, which specifies the needed gain, and computes an optimal per-amplifier-stage gain profile based on the performance requirement of the currently active standard and the characteristic of each individual amplifier. The per-amplifier-stage gain profile can then be applied to each individual amplifier stage to accomplish gain control at each individual amplifier.

Figure 2:
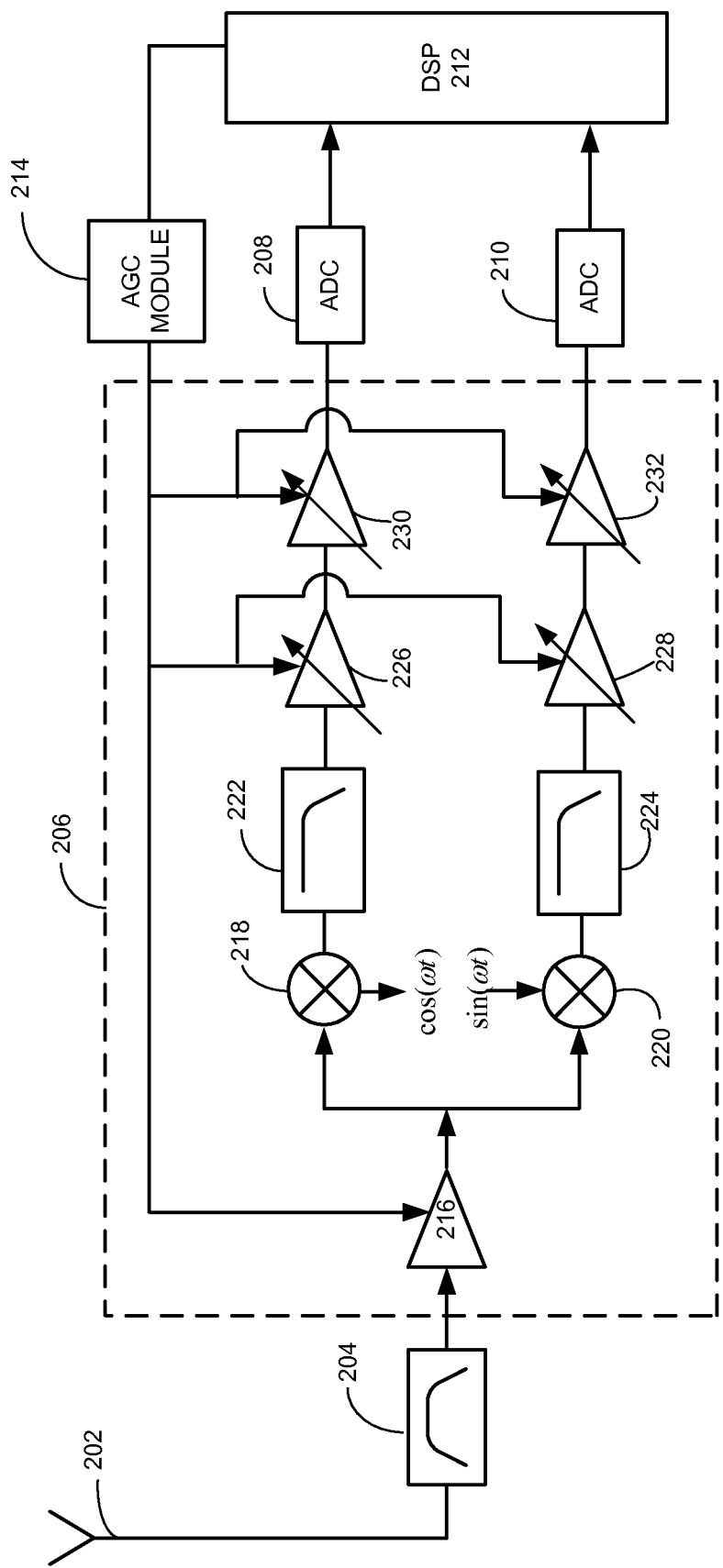
FIG. 2 presents a diagram illustrating the architecture of a wireless receiver, in accordance with an embodiment of the present invention.

FIG. 2 presents a diagram illustrating the architecture of a wireless receiver, in accordance with an embodiment of the present invention. In FIG. 2, receiver 200 includes an antenna 202, a BPF 204, an RFIC chip 306, ADCs 208 and 210, a baseband DSP 212, and an AGC module 214. RFIC chip 206 includes demodulation-and-amplification circuits, including an LNA 216, mixers 218 and 220, LPFs 222 and 224, first-stage variable gain amplifiers (VGAs) 226 and 228, and second-stage VGAs 230 and 232.

During operation, antenna 202, RFIC chip 206, and ADCs 208 and 210 perform various functions that are similar to the ones in the conventional receiver shown in FIG. 1, including receiving, filtering, modulating, amplifying, and AD converting radio signals. Baseband DSP 212 receives digital signals from ADCs 208 and 210 and determines the amount of gain necessary to achieve the best ADC performance based on the received digital signals. Unlike the conventional scheme, baseband DSP 212 no longer needs to control the gain of individual amplifier stages directly. Instead, DSP 212 sends the information about the needed gain to AGC module 214, which in turn uses such information and information associated with characteristics of each individual amplifier and the current active standard to determine a gain profile. This gain profile specifies how much gain adjustment each individual amplifier needs to undergo. AGC module 214 then sends control signals to each individual amplifier to make the corresponding gain adjustment. For example, DSP 212 may determine that an extra gain of 10 dB is needed to get optimal ADC performance and report such value to AGC module 214. AGC module 214 is aware of the current active standard and its performance requirement, and is aware of the characteristics, such as noise figure, power efficiency, and P1 dB (output power at 1 dB compression), of amplifiers 216, 226, 228, 230, and 232. Based on this information, AGC module 214 determines that an optimal solution to obtain the extra 10 dB gain would be to ask LNA 216 to increase its gain by 3 dB, first stage amplifiers 226 and 228 to increase their gain by 4 dB, and second stage amplifiers 230 and 232 to increase their gain by 3 dB. Subsequently, AGC module 214 sends appropriate control signals to each amplifier to adjust the gain of each amplifier.

Figure 3:
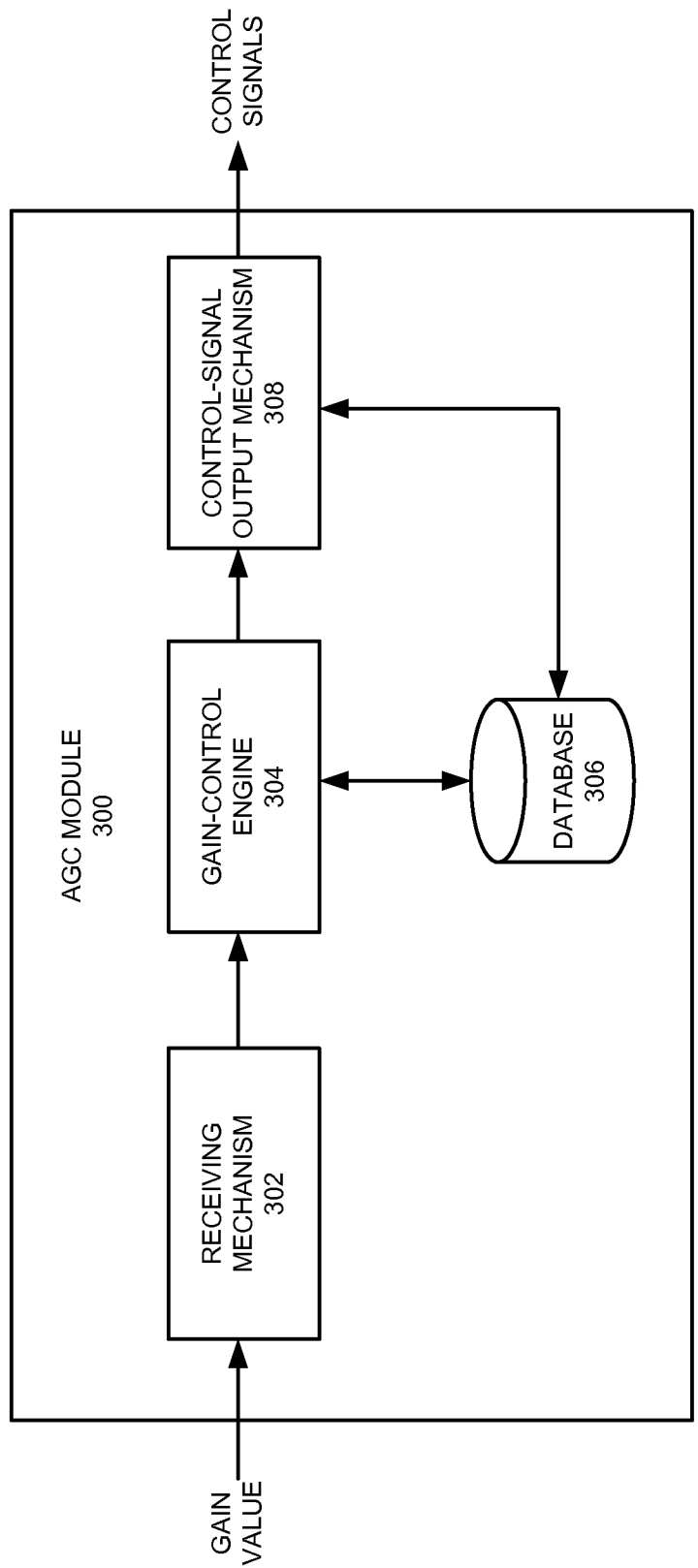
FIG. 3 presents a diagram illustrating the architecture of an AGC module, in accordance with an embodiment of the present invention.

FIG. 3 presents a diagram illustrating the architecture of an AGC module, in accordance with an embodiment of the present invention. In FIG. 3, AGC module 300 includes a receiving mechanism 302, a gain-control engine 304, a database 306, and a control-signal output mechanism 308.

Receiving mechanism 302 is responsible for receiving a gain value from the baseband DSP. Note that the gain value can be in dB or linear scale, and can be a positive or negative value. A positive value means that the amplifiers need to increase their overall gain, whereas a negative value means that the amplifiers need to reduce their overall gain.

Gain-control engine 304 is responsible for determining the gain profile, which specifies how much gain adjustment is needed at each individual amplifier. To do so, gain-control engine 304 interacts with a database 306, which stores characteristics of each individual amplifier and performance requirements of various wireless standards. The amplifier characteristics include, but are not limited to: gain, noise figure, power efficiency, and P1 dB value. The various wireless standards include, but are not limited to: WiFi, Global System for Mobile Communications (GSM), Wideband Code Division Multiple Access (WCDMA), Worldwide Interoperability for Microwave Access (WiMAX), Long Term Evolution (LTE), etc.

In one embodiment, gain-control engine 304 performs a table lookup based on the received gain value, characteristics of each individual amplifier, and the requirement of the currently active standard to obtain a gain profile, which specifies the amount of gain adjustment needed at each amplifier. In one embodiment, the gain profile is an optimal, or at least sub-optimal, solution that meets the currently active standard and considers the amplifier characteristics. For example, certain standards may require minimum power consumption, whereas a different standard may care less about power consumption but require minimum noise. In addition, different amplifiers may have different characteristics; some may have better power efficiency, while some may have better noise performance. Hence, if the currently active standard calls for minimum power consumption, the optimal solution would be to ask the amplifier with better power efficiency to provide the majority of the needed gain. On the other hand, if the currently active standard calls for minimum noise, the optimal solution would be to ask the amplifier with better noise performance to provide the majority of the needed gain. The table that specifies various gain control scenarios can be maintained in database 306. In a further embodiment, the table can be edited by the user in a such a way that new entries can be generated and old entries can be modified or deleted. In addition to table lookup, gain-control engine 304 may also run an algorithm to compute the gain profile using the aforementioned parameters, such as the received gain value, characteristics of each individual amplifier, and the requirement of the currently active standard.

Control-signal output mechanism 308 is responsible for outputting appropriate gain control signals to the amplifiers based on the gain profile. Note that different types of control may be needed for different types of amplifiers. For example, gain of the VGAs can be adjusted by a voltage signal. These gain control signals control the gain of each individual amplifier, thus obtaining optimal signal levels at the inputs of the ADCs.

Figure 4:
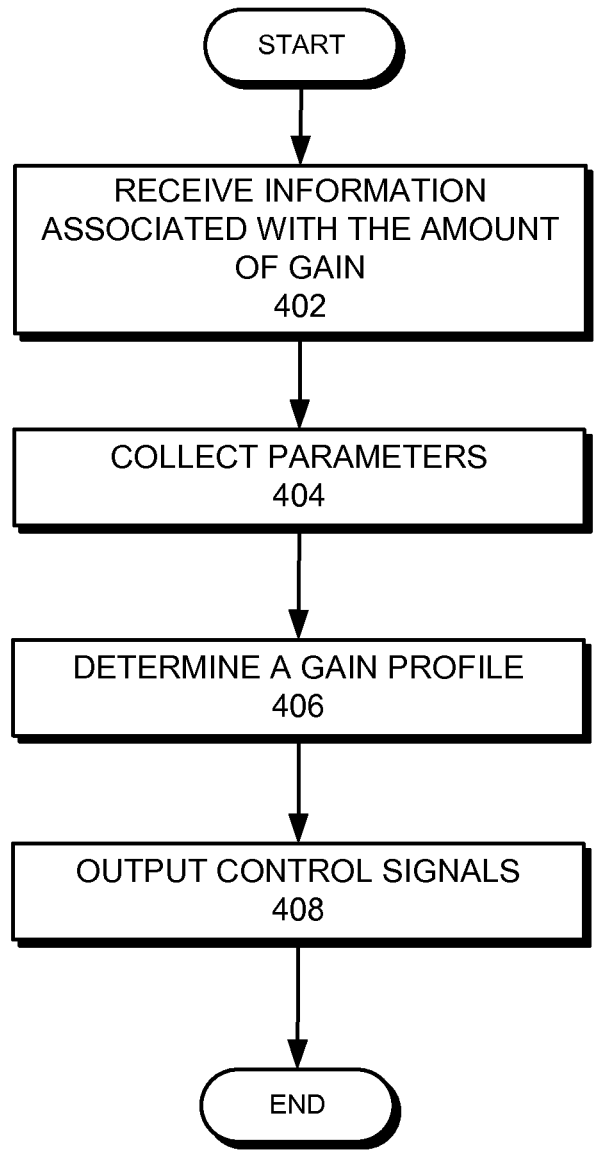
FIG. 4 presents a flowchart illustrating the process of smart automatic gain control for a wideband receiver, in accordance with an embodiment of the present invention.

FIG. 4 presents a flowchart illustrating the process of smart automatic gain control for a wideband receiver, in accordance with an embodiment of the present invention. During operation, the system receives information associated with the amount of gain which will be needed (operation 402). In one embodiment, this gain information is provided by the baseband DSP, and can be a simple numerical value in dB or linear scale. The system then collects a number of parameters, including but not limited to: the performance requirement of the currently active standard, and characteristics, such as gain, noise figure, power efficiency, and P1 dB, associated with each amplifier in the receiving path (operation 404). Based on the received gain value and the collected parameters, the system determines a gain profile that specifies how each amplifier should adjust its gain (operation 406). In one embodiment, the determination operation involves table lookup. In one more embodiment, the determination operation involves running an algorithm. Subsequently, the system outputs a number of control signals, with each control signal controlling the gain of a corresponding amplifier based on the determined gain profile (operation 408).

Figure 5:
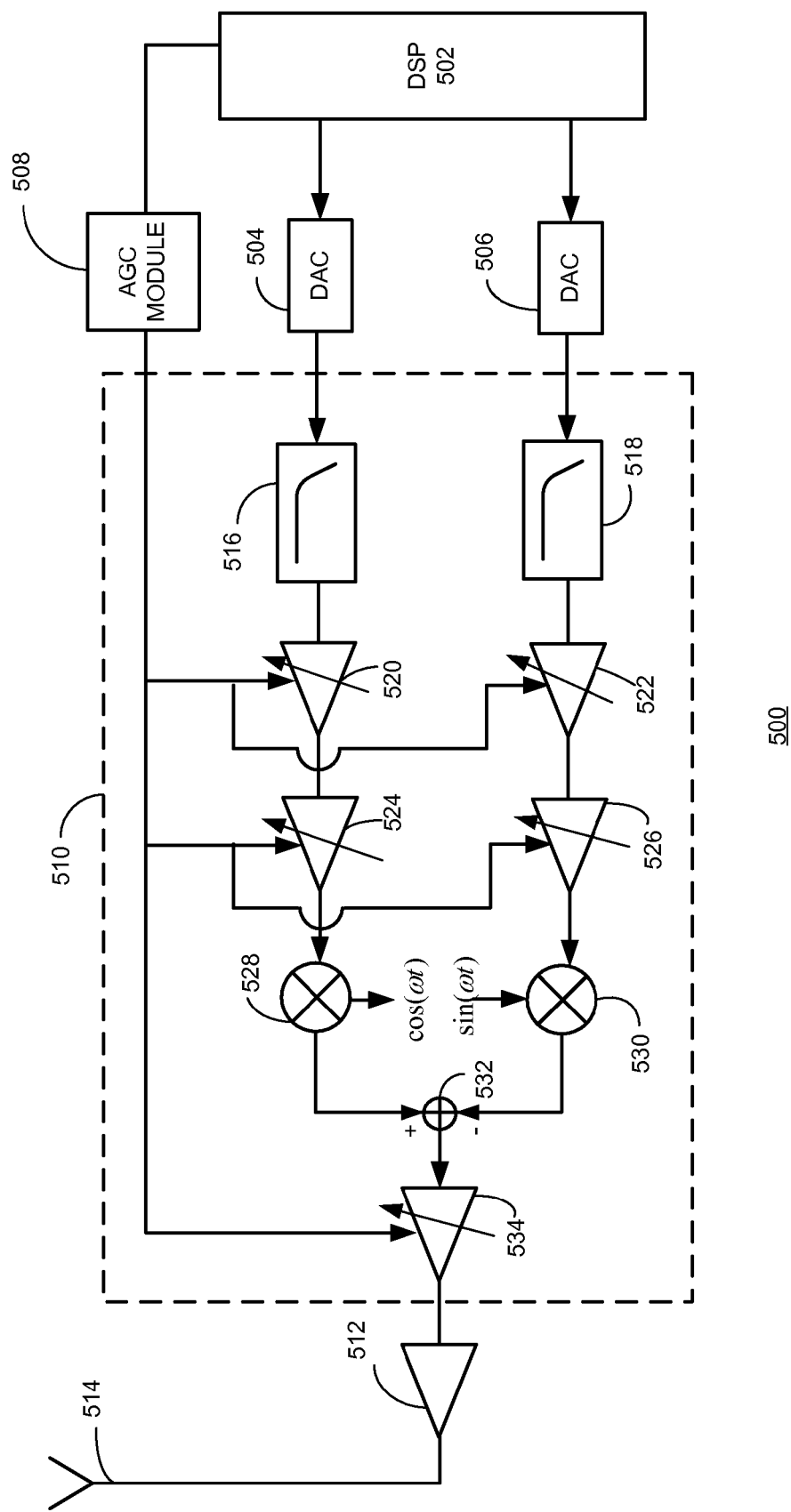
FIG. 5 presents a diagram illustrating the architecture of a wireless transmitter, in accordance with an embodiment of the present invention.

In addition to being incorporated as part of a wideband multi-standard receiver, the AGC module can also be part of a wideband multi-standard transmitter and performs similar gain control logic to make sure that the output of the transmitter meets the requirement of the currently active standard. FIG. 5 presents a diagram illustrating the architecture of a wireless transmitter, in accordance with an embodiment of the present invention.

In FIG. 5, transmitter 500 includes a baseband DSP 502, digital-to-analog converters (DACs) 504 and 506, an AGC module 508, an RFIC chip 510, a power amplifier 512, and an antenna 514. RFIC chip 510 includes LPFs 516 and 518, first-stage VGAs 520 and 522, second-stage VGAs 524 and 526, mixers 528 and 530, an adder 532, and a power-amplifier driver 534.

During operation, baseband DSP 502 outputs I and Q channel baseband digital signals to DACs 504 and 506, respectively, which convert the digital signals to the analog domain. The converted analog signals are then filtered and amplified by LPFs 516 and 518 and the first and second stage amplifiers, and are modulated by a modulator that includes mixers 528 and 530 and adder 532. Note that other standard components of the modulator, such as the local oscillator and the phase shifter, are not shown in FIG. 5. The modulated signal is then sent to the power amplifier 512 via power-amplifier driver 534. To ensure that the input of power amplifier 512 has an optimal level that meets the input requirement of power amplifier 512 and the requirement of the currently active standard, AGC module 508 controls each individual amplifier stage in the transmitting path. The operation of AGC module 508 is similar to that of AGC module 214 shown in FIG. 2. More specifically, AGC module 508 receives an input from baseband DSP 502 that indicates the amount of gain which would be needed, and outputs a number of control signals that control the gain of each individual amplifier on the transmitting path, including VGAs 520-526 and power-amplifier driver 534. Note that AGC module 508 generates the control signals based on characteristics of the amplifiers as well as the requirement of the currently active standard. Also note that, because outputs to DACs 504 and 506 are generated by baseband DSP 502, baseband DSP 502 knows ahead of time the amount of overall gain which would be needed from the various stages of amplifiers.

By implementing a smart AGC module that is separate from the baseband DSP, embodiments of the present invention relieve the burden of controlling each individual amplifier from the baseband DSP. Instead of having to design a complicated AGC algorithm, the baseband DSP only needs to output a numerical value to the AGC module via a simple AGC control interface. The AGC module, which can be a standalone component (as seen in FIGS. 2 and 5) or a part of the RCIC chip, has all the intelligence needed for gain control, including the specs of each individual component on the RFIC and requirements of wireless standards, and is thus able to determine a power control solution that not only satisfies the gain requirement set by the baseband DSP, but also is optimal in terms of noise figure, power consumption, and linearity.

Note that the receiver and transmitter architectures shown in FIGS. 2 and 5 are merely exemplary and should not limit the scope of this disclosure. In the examples shown in FIGS. 2 and 5, the receiver and transmitter implement quadrature modulation and demodulation schemes, respectively. Other modulation/demodulation schemes are also possible. Moreover, other than direct conversion of the received radio signal, the demodulator may also down-convert the received signal to a signal at an intermediate frequency (IF). In the examples shown in FIGS. 2 and 5, two amplifier stages are implemented. In general, the number of amplifier stages is not limited to two; fewer or more amplifier stages can be included in the receiver or transmitter. In addition, in FIGS. 2 and 5, the AGC modules are standalone unit. In general, the AGC modules can also be part of the RFIC. For example, the AGC module may be a function block on the RFIC.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit this disclosure. Accordingly, many modifications and variations will be apparent to practitioners skilled in the art. The scope of the present invention is defined by the appended claims.

What is claimed is:

1. A method for accomplishing automatic gain control (AGC) for a wireless communication system comprising a plurality of amplifiers, comprising:
   receiving, from a baseband signal processor, an input that indicates a total amount of gain adjustment;
   obtaining, from a database, amplification characteristics associated with at least one of the amplifiers, wherein the obtained amplification characteristics include one or more of: a gain value, a noise figure, a nonlinearity measure, and a power efficiency measure;
   determining a desired performance requirement;
   calculating a per-amplifier-stage gain profile based on the amplification characteristics obtained from the database, the total amount of gain adjustment, and the desired performance requirement; and
   outputting a plurality of control signals based on the generated per-amplifier-stage gain profile, wherein a respective control signal independently controls gain of a corresponding amplifier, thereby enabling the wireless communication system to achieve the total amount of gain adjustment while meeting the desired performance requirement.

2. The method of claim 1, wherein the desired performance requirement is determined based on a wireless communication standard that is currently active on the wireless communication system.

3. The method of claim 1, wherein the desired performance requirement includes one or more of:
   a noise figure requirement;
   a power efficiency requirement; and
   a linearity requirement.

4. The method of claim 1, wherein calculating the gain profile involves performing a table lookup.

5. An automatic gain control (AGC) module for a wireless communication system comprising a plurality of amplifiers, the AGC module comprising:
   a database storing amplification characteristics associated with at least one of the amplifiers, wherein the amplification characteristics include one or more of: a gain value, a noise figure, a nonlinearity measure, and a power efficiency measure;
   a receiving mechanism configured to receive, from a baseband signal processor, an input that indicates a total amount of gain adjustment;
   an amplification-characteristics-obtaining mechanism configured to obtain, from the database, amplification characteristics associated with at least one of the amplifiers;
   a determining mechanism configured to determine a desired performance requirement;
   a gain-control engine configured to generate a per-amplifier-stage gain profile based on the amplification characteristics obtained from the database, the total amount of gain adjustment, and the desired performance requirement; and
   an output mechanism configured to output a plurality of control signals based on the generated per-amplifier-stage gain profile, wherein a respective control signal independently controls gain of a corresponding amplifier, thereby enabling the wireless communication system to achieve the total amount of gain adjustment while meeting the desired performance requirement.

6. The AGC module of claim 5, wherein the desired performance requirement is determined based on a wireless communication standard that is currently active on the wireless communication system.

7. The AGC module of claim 5, wherein the desired performance requirement includes one or more of:
   a noise figure requirement;
   a power efficiency requirement; and
   a linearity requirement.

8. The AGC module of claim 5, wherein while generating the gain profile, the gain-control engine is configured to perform a table lookup.

9. The AGC module of claim 5, wherein the AGC module is configured to receive the input from a baseband digital signal processor (DSP).

10. The AGC module of claim 5, wherein the AGC module is a separate component of the baseband DSP.

11. A wireless receiver, comprising:
    a plurality of amplifiers;
    a demodulator;
    a baseband digital signal processor (DSP); and
    an automatic gain control (AGC) module, wherein the automatic gain control module further comprises:
      a receiving mechanism configured to receive, from the baseband DSP, an input that indicates a total amount of gain adjustment;
      a database storing amplification characteristics associated with at least one of the amplifiers, wherein the amplification characteristics include one or more of: a gain value, a noise figure, a nonlinearity measure, and a power efficiency measure;
      an amplification-characteristics-obtaining mechanism configured to obtain, from the database, amplification characteristics associated with at least one of the amplifiers;
      a determining mechanism configured to determine a desired performance requirement;
      a gain-control engine configured to generate a per-amplifier-stage gain profile based on the amplification characteristics obtained from the database, the total amount of gain adjustment, and the desired performance requirement; and
      an output mechanism configured to output a plurality of control signals based on the generated per-amplifier-stage gain profile, wherein a respective control signal independently controls gain of a corresponding amplifier, thereby enabling the wireless receiver to achieve the total amount of gain adjustment while meeting the desired performance requirement.

12. The receiver of claim 11, wherein the desired performance requirement is determined based on a currently active wireless communication standard.

13. The receiver of claim 11, wherein the desired performance requirement includes one or more of:
    a noise figure requirement;
    a power efficiency requirement; and
    a linearity requirement.

14. The receiver of claim 11, wherein while generating the gain profile, the gain-control engine is configured to perform a table lookup.

15. The receiver of claim 11, wherein the demodulator is a quadrature demodulator.

16. A wireless transmitter, comprising:
    a plurality of amplifiers;
    a modulator;
    a baseband digital signal processor (DSP); and
    an automatic gain control (AGC) module, wherein the automatic gain control module further comprises:
      a receiving mechanism configured to receive, from the baseband DSP, an input that indicates a total amount of gain adjustment;

a database storing amplification characteristics associated with at least one of the amplifiers, wherein the amplification characteristics include one or more of: a gain value, a noise figure, a nonlinearity measure, and a power efficiency measure;

an amplification-characteristics-obtaining mechanism configured to obtain, from the database, amplification characteristics associated with at least one of the amplifiers;

a determining mechanism configured to determine a desired performance requirement;

a gain-control engine configured to generate a per-amplifier-stage gain profile for the amplifiers based on the amplification characteristics obtained from the database, the total amount of gain, and the desired performance requirement; and an output mechanism configured to output a plurality of control signals based on the generated gain profile, wherein a respective control signal independently controls gain of a corresponding amplifier, thereby enabling the wireless transmitter to achieve the total amount of gain adjustment while meeting the desired performance requirement.

\* \* \* \* \*